(12) United States Patent
Kerber

(10) Patent No.: US 7,550,986 B2
(45) Date of Patent: Jun. 23, 2009

(54) SEMICONDUCTOR WAFER HAVING A DIELECTRIC RELIABILITY TEST STRUCTURE, INTEGRATED CIRCUIT PRODUCT AND TEST METHOD

(75) Inventor: Martin Kerber, Munich (DE)

(73) Assignee: Infineon Technologies AG, Munich (DE)

( * ) Notice: Subject to any disclaimer, the term of this patent is extended or adjusted under 35 U.S.C. 154(b) by 261 days.

(21) Appl. No.: 11/412,548

(22) Filed: Apr. 27, 2006

(65) Prior Publication Data

US 2007/0252611 A1 Nov. 1, 2007

(51) Int. Cl.
*G01R 31/02* (2006.01)
*G01R 27/00* (2006.01)
*G01R 31/28* (2006.01)

(52) U.S. Cl. ..................................... 324/763

(58) Field of Classification Search ......... 324/760–765, 324/158.1; 438/14–17; 156/345
See application file for complete search history.

(56) References Cited

U.S. PATENT DOCUMENTS

| | | | |
|---|---|---|---|
| 6,188,234 B1 | 2/2001 | Abadeer et al. | 324/766 |
| 6,583,641 B2 | 6/2003 | Wang et al. | 324/765 |
| 6,724,214 B2 | 4/2004 | Manna et al. | 324/766 |
| 6,747,471 B1 * | 6/2004 | Chen et al. | 324/765 |
| 6,806,696 B1 | 10/2004 | Kim | 324/71.5 |
| 6,821,833 B1 | 11/2004 | Chou et al. | 438/199 |
| 6,831,451 B1 | 12/2004 | Kim et al. | 324/71.5 |
| 6,967,499 B1 | 11/2005 | Haase et al. | 324/766 |
| 7,030,458 B2 * | 4/2006 | Marr | 257/530 |
| 7,129,923 B2 * | 10/2006 | Lu | 345/92 |

FOREIGN PATENT DOCUMENTS

JP 2001-127126 5/2001

OTHER PUBLICATIONS

De et al., "Reliability characterization of high density Metal-Insulator-Metal Capacitors (MIMCAP) fabricated by depositing Silicon Nitride using PECVD in Compound Semiconductor Manufacturing", ANADIGICS, Inc., available at http://www.gaasmantech.org/Digests/2005/2005papers/7.5.pdf.
Beall et al., "Silicon Nitride MIM Capacitor Reliability for Multiple Dielectric Thicknesses", TriQuint Semiconductor, available at http://www.gaasmantech.org/Digests/2002/PDF/08a.pdf.
Alan W. Shaw, "FET Operation", presentation 2004, available at http://www.engineering.usu.edu/classes/ece/5470/shows/FET_operation.pdf.

* cited by examiner

*Primary Examiner*—Jermele M Hollington
*Assistant Examiner*—Trung Q Nguyen
(74) *Attorney, Agent, or Firm*—Davidson, Davidson & Kappel, LLC

(57) ABSTRACT

A semiconductor wafer includes a dielectric test structure including a voltage line, a control line, and a plurality of test devices connected in parallel to the voltage line and the control line. Each test device includes a voltage-controlled resistor connected to the control line and a dielectric device, the dielectric device being connected to the voltage line via the voltage-controlled resistor. A method for dielectric reliability testing and forming an integrated circuit product is also provided, as is a wafer with a control voltage pad and an integrated circuit product.

9 Claims, 5 Drawing Sheets

SEMICONDUCTOR WAFER HAVING A DIELECTRIC RELIABILITY TEST STRUCTURE, INTEGRATED CIRCUIT PRODUCT AND TEST METHOD

BACKGROUND OF THE INVENTION

The present invention relates to the reliability testing of dielectrics in semiconductor wafers.

The article "Reliability characterization of high density Metal-Insulator-Metal Capacitors (MIMCAP) fabricated by depositing Silicon Nitride using PECVD in Compound Semiconductor Manufacturing" by Bhola N. De and Mohesen Shokrani (2005)(http://gaas.org/Digests/2005/2005papers/7.5.pdf), hereby incorporated by reference herein, describes a capacitor bank structure for on-wafer time dependent dielectric breakdown (TDDB) tests.

U.S. Pat. Nos. 6,724,214, 6,806,696 and 6,831,451 disclose test structures and are also hereby incorporated by reference herein.

U.S. Pat. No. 6,821,833 describes a method of forming pFET and nFET areas on a semiconductor substrate covered with gate dielectric layers, and is hereby incorporated by reference herein.

BRIEF SUMMARY OF THE INVENTION

The present invention provides a semiconductor wafer having at least one dielectric test structure. The test structure includes a voltage line, a control line and a plurality of test devices connected in parallel to the voltage line and the control line. Each test device includes a voltage-controlled resistor connected to the control line and a dielectric device, the dielectric device being connected to the voltage line via the voltage-controlled resistor.

The present invention also includes an integrated circuit product having the test structure.

The present invention also provides a method for dielectric reliability testing comprising:

performing a first reliability test phase on a dielectric test structure having a voltage supply pad and a further pad; the first reliability test providing a first voltage to the voltage supply pad while supplying a control voltage to the further pad to set a voltage controlled resistor into a low resistive state; and performing a second reliability test phase on the dielectric test structure by providing a second voltage to the voltage supply pad while supplying a further control voltage to the further pad to set the voltage controlled resistor into a high resistive state.

The present invention also provides a method for creating integrated circuit products using the method for dielectric reliability testing.

The present invention also provides a semiconductor wafer comprising a local dielectric test structure having a voltage supply line, a control line for varying a resistance of the test structure, and a source line, a first pad connected to the voltage supply line, and a second pad connected to the control line.

BRIEF DESCRIPTION OF THE SEVERAL VIEWS OF THE DRAWING(S)

The present invention will be further described with reference to a preferred embodiment, in which.

DETAILED DESCRIPTION OF THE INVENTION

Figure 1A:
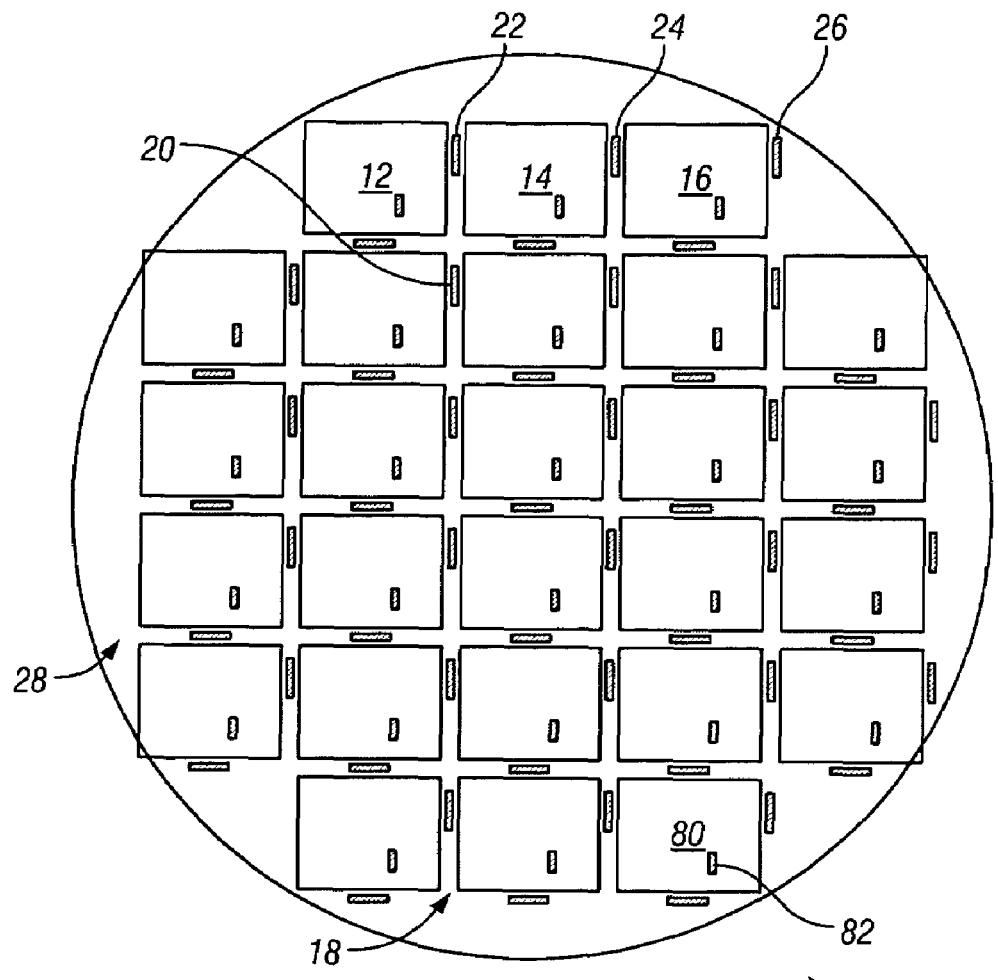
FIG. 1a shows schematically one embodiment of a wafer having a test structure of the present invention at a die location.

FIG. 1a shows schematically a wafer 10 having a plurality of die areas 12, 14, 16 between scribe lines 18, 28. Wafer 10 may be for example a 200 or 300 mm p-substrate wafer. More than fifty die areas may for example be provided on the wafer 10. The dielectric layer may be a silicon dioxide layer or a high K dielectric layer which may be made for example of $Si_xN_y$, $Ta_2O_5$, $Al_2O_3$, $TiO_2$ or PZT and has a K value greater than four. Wafer 10 alternately may be an n-substrate wafer.

Wafer 10 may be processed to create various integrated circuit products at the die areas 12, 14, 16, such as integrated circuit product 80. In order to determine the dielectric properties of wafer 10, dielectric reliability testing is performed on wafer 10 at various individual locations of the wafer 10. Local reliability properties thus can be determined.

Wafer 10 has test structures 20, 22, 24, 26, shown schematically here and typically formed into the depth of the wafer at the scribe lines 18, 28 next to die areas 12, 14, 16. The test structures 20, 22, 24, 26 in this embodiment each have pads to permit testing at each test area, as will be described with reference to FIGS. 1b, 1c and 1d. A test device thus can be connected to the pads of the test structure.

While the test structures 20, 22, 24, 26 are shown here in the scribe lines, the test structures of the present invention also may be provided on at the die areas with the products 80 formed in die areas 12, 14, 16, in which case the test structure 82 typically is insulated from the product structure. The test structures also could be located on a test wafer to create a map which can then be used for subsequent production using similar wafers.

Figure 1B:
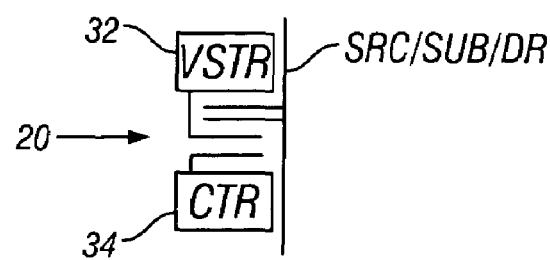
FIG. 1b shows schematically one embodiment of the test structure placed in the spacing between a voltage pad and a control pad.

FIG. 1b shows a pad 32 for the test voltage Vstr and a pad 34 for the control voltage Ctr, the test structure 20 being located between the pads.

Figure 1C:
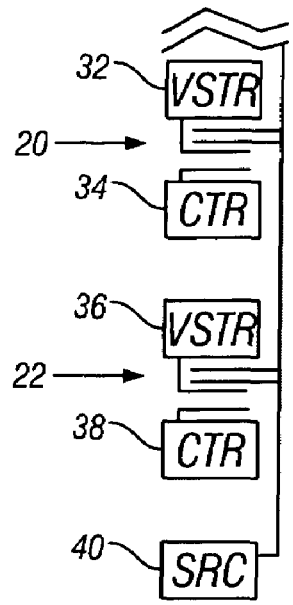
FIG. 1c shows an arrangement of multiple test structures in a line which share a common pad for source and for drain connection.

FIG. 1c shows a test apparatus where a first test structure 20 is placed between the pads 32, 34 and a second test structure is placed between a voltage pad 36 and a control pad 38, the test structures sharing a common source/drain line having a single pad 40.

FIG. 1c shows a test apparatus where three test structures share a source/drain line having a single pad, and also share a control line connected to a control pad 33.

Figure 1D:
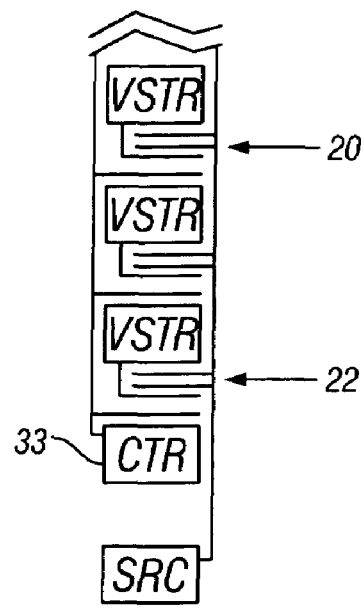
FIG. 1d shows a set of multiple test structures with individual pads for the voltage line but a shared control line.
Figure 2A:
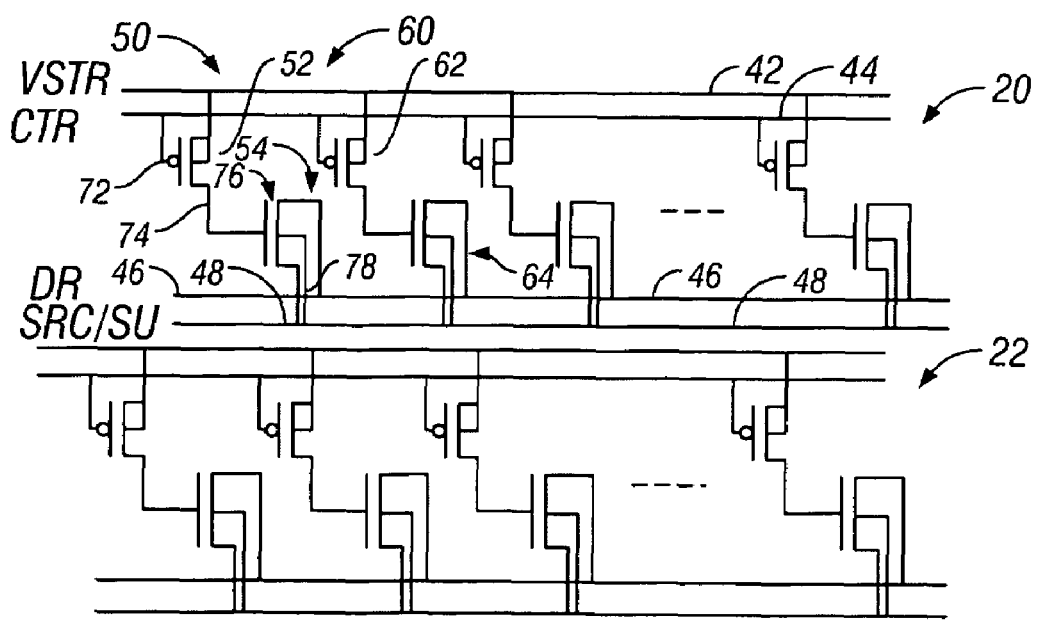
FIG. 2a shows schematically one embodiment of the test structure of FIG. 1a in more detail, this embodiment using pFET transistors as voltage-controlled resistors.

FIG. 2a shows schematically one test structure 20 of FIGS. 1a, 1b, 1c and 1d, with a voltage line 42, a control line 44, a drain line 46 and a source line 48. Lines 42, 44, 46, 48 may connect to pads shown in FIG. 1c for example, so that line 42 connects to pad 32, line 44 to pad 34 and lines 46 and 48 to pad 40.

Connected in parallel between the lines 42, 44 and lines 46, 48 are a plurality of test devices 50, 60. Each test device 50, 60 in this embodiment has a pFET (positive channel field effect transistor) 52, 62, respectively, and an nFET 54, 64, respectively. pFET 52 has a control input 72 and an output 74. The nFET 54 has a gate 76 and an output 78 connected to source line 48 and an input connected to drain 46. Source line 48 and drain 46 may be connected. The gate 76 is connected to the pFET 52 via the pFET output 74. The control gate 76 has a gate dielectric between the input 72 and output 78, and thus the nFET is a dielectric device. Examples of other dielectric devices include capacitors, such as MOS capacitors, and any other device where electronic components are separated by a dielectric.

pFET 52 defines a voltage-controlled resistor, and is voltage controlled via control line 44. When a control voltage with high voltage difference with respect to the voltage line 42 is present, PFET 52 functions as a low resistive resistor, having for example a resistance of 100 ohms. When a lower control voltage, such as the threshold voltage $V_{th}$, is supplied via line 44 to control inputs 72, the pFET 52 has a high resistance, for example 1 megaohm. The high resistance preferably is above a typical post-breakdown resistance of the dielectric device. Voltage line 42, which has a test voltage $V_{str}$, thus is connected through PFET 52 to the control gate 76 of nFET 54. The nFET 54 is constructed on the test wafer 10 so that control gate 76 is formed using one of the dielectric layers of the wafer. Other voltage-controlled resistors may include for example nFETs (in which case the control voltage would cause a reverse resistivity) or other field effect transistors in which a control voltage alters a resistance. The voltage controlled resistor control via the control line is preferably binary so that the resistor has a first known resistance at a control voltage and a second known resistance at no voltage or a second voltage different from the control voltage.

By having a voltage-controlled resistor in the test devices, testing at different resistances advantageously may be performed on the wafer at the test structure site by changing the resistance of all of the resistors using a single control line. Moreover, a common control line and a common source line for more than one test structure may be provided, as shown in FIGS. 1c and 1d.

Figure 2B:
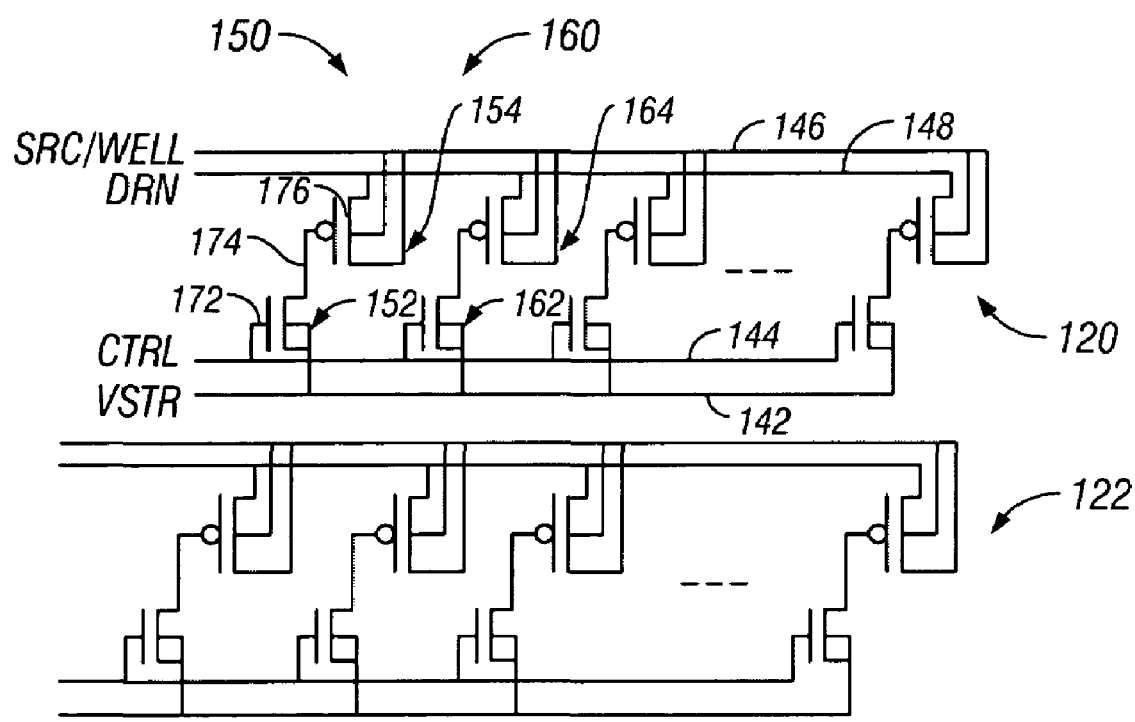
FIG. 2b shows an embodiment of the test structure which uses nFET transistors as voltage-controlled resistors.

FIG. 2b shows schematically an alternate test structure 120, with a voltage line 142, a control line 144, a drain line 146 and a source line 148, with nFET transistors as voltage-controlled resistors.

Connected in parallel between the lines 142, 144 and lines 146, 148 are a plurality of test devices 150, 160. Each test device 150, 160 in this embodiment has an nFET 152, 162, respectively, and an pFET 154, 164, respectively. nFET 152 has a control input 172 and an output 174. The pFET 154 has a gate 176 and an output 178 connected to source line 138 and an input connected to drain 138. The gate 176 is connected to the nFET 152 via the nFET output 174. The control gate 176 has a gate dielectric between the input 172 and output 178. The test structure of FIG. 2b thus can be used similar to the test structure of FIG. 2a to test the dielectric.

Figure 3:
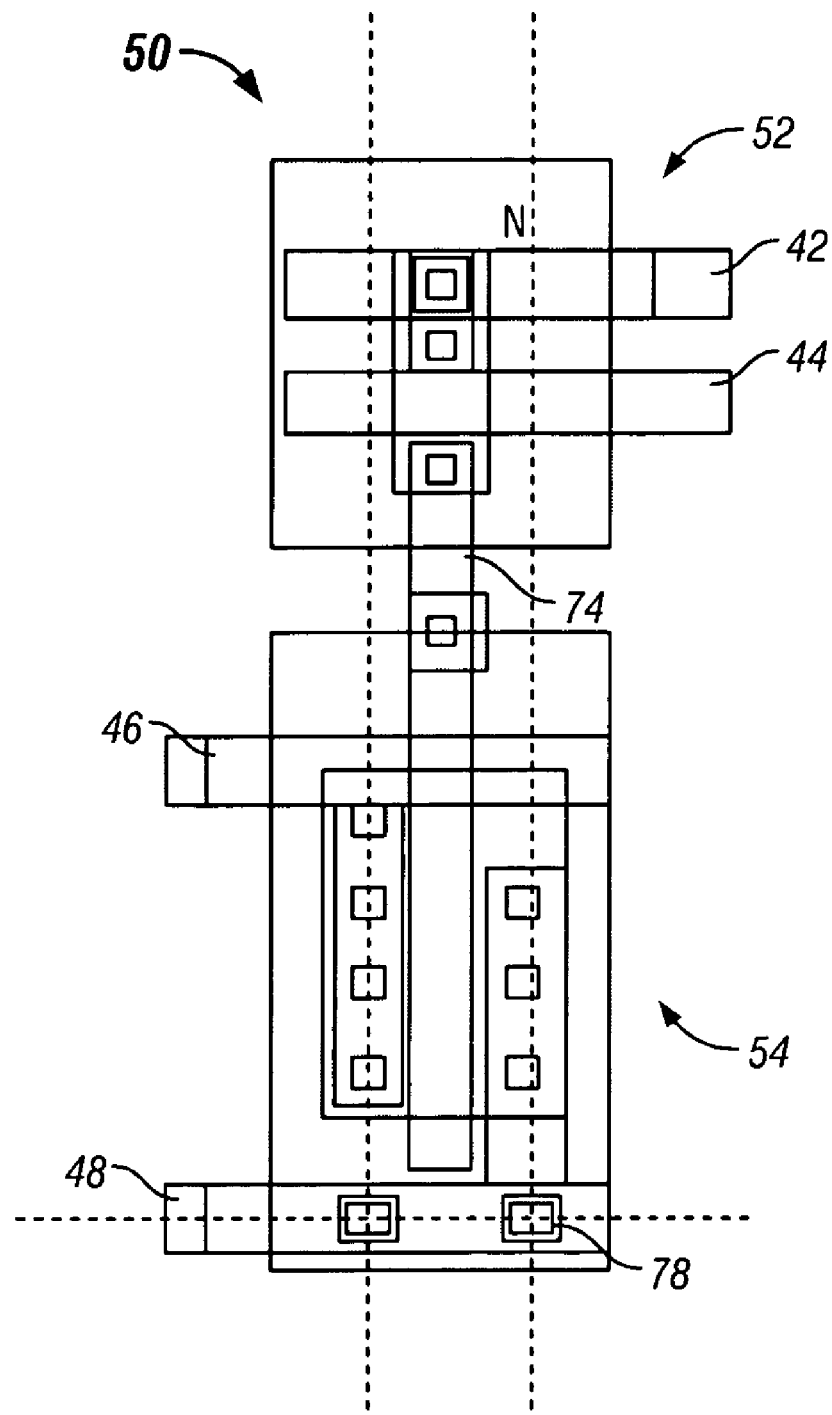
FIG. 3 shows schematically one embodiment of a resistor connected to one of the dielectric devices.

FIG. 3 shows a possible pixel structure for one of the test devices 50 on the wafer 10. nFET 54 can be formed on a p-substrate wafer, with the n-diffusion for the nFET 54 being located over the p-substrate or well. The gate dielectric of control gate 76 is formed from the dielectric layer of the wafer, which may be for example a silicon dioxide layer or a high K layer. The pFET 52 can be formed on an n-doped area of the wafer, which may be to the side of the nFET 54.

To characterize the dielectric median time to failure (MTTF) of the capacitors, various tests can be run on the test structure 22. A test typically is a sequence of stress periods and sense periods. During the stress period the voltage controlled resistors are put into the low resistive stage by applying an appropriate voltage to the control line and a high stress voltage, typically larger than 3 Vdd, to the voltage line. During the sense period the voltage controlled resistors are switched into the high resistive stage (sense resistor) and a sense voltage, typically lower than 3 times Vdd, is applied to the voltage line. The current flowing into the voltage line is recorded. During the sense period the stress essentially is interrupted or slowed down according to the voltage acceleration model. Dielectric breakdown in one test device expresses in a digital step of the sense current which basically is controlled by the highly resistive sense resistor. Stress periods and sense periods are concatinated until all or at least the majority of the test devices experience dielectric breakdown. The duration of the stress periods may increase with increasing cumulative stress duration to provide a sequence of sense readings appearing equidistant on a logarithmic time scale. The current during the stress periods may be recorded as well. Although the stress current is less sensitive to the number of breakdown events in the test array, any changes can be used to trigger additional sensing periods. The test for example can be run by applying the stress and sense voltages at the pad 32, and applying the control voltage at pad 34 during the stress period which sets the voltage dependent resistor in the low resistive stage. Since the pFETs 52 then are in a low resistive stage, little voltage drop occurs across the PFET 52 and the nFET gate dielectric can be characterized for example using a ramped voltage (VRDB) test using a linear acceleration model. Other tests to generate a full Weibull distribution maybe used.

The sense period occurs when the pFETs 52 have large resistances when a control voltage is supplied to pad 34 and control line 44.

Figure 4:
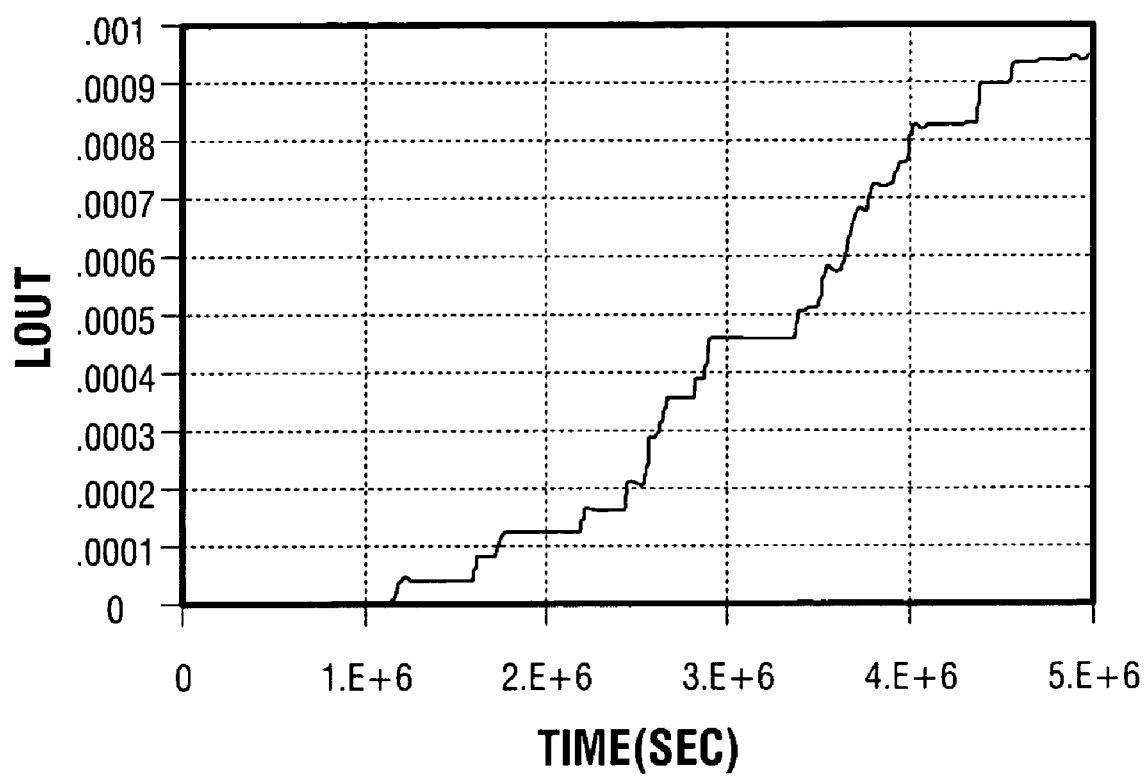
FIG. 4 shows a chart for breakdown of the dielectric devices over time using a fixed 100 kOhm for a sample with 24 dielectric devices.

FIG. 4 shows an example of such a sense period, although it is noted that this test was not run on the test structure 22, but on an nFET array with a 12 nm thick gate dielectric (oxide layer) with 24 nFETs connected to a stress line via 100 kOhm fixed resistors. Also the sense voltage was equal to the stress voltage in this case.

A sense voltage, for example 3 times Vdd in this case, was applied to the nFET array, and the output current in amps at a source line was measured. Since the sense voltage passes through the dielectric of the capacitor of the nFET, as long as the dielectrics are functioning properly little or no current passes through to the source line. As the capacitors of the nFET fail and thus short-circuit (and they rarely do so together), a current passes through the 100 kOhm resistor and the nFET to the source line.

A similar sense period can be used with the present test structure 22 when voltage is supplied to the control line via pad 34, the pFET 52 then having a first high resistance and functioning as a highly resistive element. A sense voltage can be applied at pad 32, typically lower than 3 times Vdd. A time dependent dielectric breakdown test (TDDB) then can give an estimate of the MTTF of the dielectric of the test structures 20, 22, 24, 26, respectively. The high resistance during this test permits accurate measurement of the breakdown events, since the current passes through the resistor and the voltage difference between lines 42 and 48 is thus more easily measured. The time for the TDDB test can occur from 10 s to 10,000 s after the stress voltage is applied, for example.

The method advantageously provides for different reliability tests to be performed via applying a control voltage.

The testing can occur directly on the wafer, or, if the test structure 82 as in FIG. 1 is provided on a product, on integrated circuit products which are formed after the wafer has been cut. The embodiment shown here permits both sense and stress testing on a single test structure with a minimum of complexity, and various other embodiments within the scope of the claims also may be provided.

What is claimed is:

1. A semiconductor wafer comprising:
a dielectric test structure formed on the semiconductor wafer and including a voltage line, a control line, and a plurality of test devices connected in parallel to the voltage line and to the control line, each test device including a voltage-controlled resistor connected to the control line and a dielectric device, the dielectric device being connected to the voltage line via the voltage-controlled resistor.

2. The semiconductor wafer as recited in claim 1 further comprising a scribe line, the dielectric test structure being located in the scribe line.

3. The semiconductor wafer as recited in claim 1 further comprising an integrated circuit product, the dielectric test structure being located within the integrated circuit product.

4. The semiconductor wafer as recited in claim 1 further comprising a first pad connected to the voltage line and a second pad connected to the control line.

5. The semiconductor wafer as recited in claim 1 further comprising a second dielectric test structure formed on the semiconductor wafer and including a second voltage line, a second control line, and a plurality of second test devices connected in parallel to the second voltage line and to the second control line, each second test device including a second voltage-controlled resistor connected to the second control line and a second dielectric device, the second dielectric device being connected to the second voltage line via the second voltage-controlled resistor.

6. The semiconductor wafer as recited in claim 1 wherein the dielectric device is an nFET.

7. The semiconductor wafer as recited in claim 1 wherein the voltage-controlled resistor is a pFET.

8. The semiconductor wafer as recited in claim 1 wherein the dielectric device includes a high K dielectric material.

9. An integrated circuit product formed from a semiconductor wafer comprising a dielectric test structure formed on the semiconductor wafer including a voltage line, a control line, and a plurality of test devices connected in parallel to the voltage line and to the control line, each test device including a voltage-controlled resistor connected to the control line and a dielectric device, the dielectric device being connected to the voltage line via the voltage-controlled resistor.

* * * * *